(12) United States Patent
Nagatomo

(10) Patent No.: US 9,360,298 B2
(45) Date of Patent: Jun. 7, 2016

(54) SURFACE EMITTING LASER AND OPTICAL COHERENCE TOMOGRAPHY MEASURING APPARATUS USING THE SURFACE EMITTING LASER

(71) Applicant: CANON KABUSHIKI KAISHA, Tokyo (JP)

(72) Inventor: Yasuhiro Nagatomo, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/313,567

(22) Filed: Jun. 24, 2014

(65) Prior Publication Data

US 2015/0002849 A1 Jan. 1, 2015

(30) Foreign Application Priority Data

Jun. 27, 2013 (JP) ................................. 2013-135559

(51) Int. Cl.
| | |
|---|---|
| *H01S 3/08* | (2006.01) |
| *G01B 9/02* | (2006.01) |
| *H01S 5/14* | (2006.01) |
| *H01S 5/183* | (2006.01) |
| *H01S 5/022* | (2006.01) |

(52) U.S. Cl.
CPC ............ *G01B 9/02091* (2013.01); *H01S 5/141* (2013.01); *H01S 5/18366* (2013.01); *H01S 5/0222* (2013.01)

(58) Field of Classification Search
CPC ....... H01S 5/18; H01S 5/183; H01S 5/18322; H01S 5/187; G01B 9/02004
USPC ............................................. 356/519; 372/98
See application file for complete search history.

(56) References Cited

U.S. PATENT DOCUMENTS

| 5,727,016 A * | 3/1998 | Paxton ..................... H01S 5/187 372/45.01 |
|---|---|---|
| 6,347,104 B1 * | 2/2002 | Dijaili ................. H01S 5/18302 330/250 |
| 6,549,687 B1 | 4/2003 | Kochergin |

(Continued)

FOREIGN PATENT DOCUMENTS

| JP | 9-270556 A | 10/1997 |
|---|---|---|
| JP | 2005-222968 A | 8/2005 |

OTHER PUBLICATIONS

Extended European Search Report, European Patent Office, Munich, Germany, May 2015, pp. 1-8.

(Continued)

*Primary Examiner* — Jonathan Hansen
(74) *Attorney, Agent, or Firm* — Canon USA, Inc. IP Division

(57) ABSTRACT

A surface emitting laser operable to change a wavelength of emitted light includes a first reflecting mirror, a second reflecting mirror, wherein a cavity is formed between the first reflecting mirror and the second reflecting mirror along the optical axis of the surface emitting laser, an active layer formed within the cavity, a region formed within the cavity, and a movable part situated within the region, the movable part having a refractive index different from a refractive index of the region. The wavelength of emitted light is changeable by changing the position of the movable part along the direction of the optical axis in the region.

17 Claims, 10 Drawing Sheets

(56) References Cited

U.S. PATENT DOCUMENTS

| | | |
|---|---|---|
| 6,711,203 B1 | 3/2004 | Garnache |
| 2003/0107034 A1 | 6/2003 | Viktorovitch |
| 2004/0258107 A1* | 12/2004 | Sherrer ............... G02B 6/4215 372/19 |
| 2007/0183643 A1 | 8/2007 | Jayaraman |
| 2010/0134803 A1 | 6/2010 | Baier |

OTHER PUBLICATIONS

Fred Sugihwo, XP055142453, "Design and Fabrication of Wavelength Tunable Optoelectronic Devices", cover page, p. 74, paragraph 4.2 through p. 104 and Figs. 4.7, 4.11, 5.1 and 5.8-5.9, Aug. 1998.

Extended European Search Report (for Application No. 15001888.5), European Patent Office, Munich, Germany, Jan. 15, 2016, pp. 1-10.

\* cited by examiner

SURFACE EMITTING LASER AND OPTICAL COHERENCE TOMOGRAPHY MEASURING APPARATUS USING THE SURFACE EMITTING LASER

BACKGROUND OF THE INVENTION

1. Field of the Invention

The present invention relates to a tunable-wavelength surface emitting laser, and an optical coherence tomography measuring apparatus using the surface emitting laser.

2. Description of the Related Art

Much research has been performed as of recent regarding tunable-wavelength lasers, of which the wavelength of the emitting light is tunable, since applicability to various fields such as communication, sensing, imaging, and so forth, is anticipated.

One known type of tunable-wavelength laser is a tunable-wavelength surface emitting laser element where the laser oscillation wavelength of a vertical cavity surface emitting laser (hereinafter may be abbreviated to "VCSEL") is controlled using a mirror having a cantilever structure, disclosed in Japanese Patent Laid-Open No. 9-270556.

A VCSEL is generally configured such that an active layer is disposed between a pair of distributed Bragg reflectors (hereinafter may be abbreviated to "DBR"). Laser oscillation occurs at a wavelength corresponding to the cavity length, which is determined by the distance between the pair of DBRs.

The laser element disclosed in Japanese Patent Laid-Open No. 9-270556 is operable to change the laser oscillation wavelength by changing the cavity length, which is performed by mechanically moving the position of the mirror having the cantilever structure. Hereinafter, a VCSEL of which the wavelength of emitting light can be changed may also be referred to as a "tunable-wavelength VCSEL".

U.S. Patent Laid-Open No. 2007/0183643 discloses that a tunable-wavelength VCSEL is suitable as a light source for optical coherence tomography (hereinafter may be abbreviated to "OCT").

A broad range of tunable wavelengths is preferable in a case of using a tunable-wavelength VCSEL as the light source for OCT, to improve depth resolution for OCT. Further, fast wavelength tunability is desirable to reduced OCT measurement time.

However, the present inventor has found problems to be solved regarding tunable-wavelength VCSEL.

In order to broaden the tunable wavelength range for tunable-wavelength VCSEL, the amount of displacement where an upper reflecting mirror or lower reflecting mirror is mechanically moved needs to be increased. If the spring constant of the reflective mirror is too great at this time, great force has to be applied to obtain a great displacement amount, so the spring constant preferably is not great.

Also, in order to speed up the wavelength tunability for tunable-wavelength VCSEL, the reflecting mirror has to be vibrated fast. Raising the resonance frequency for the reflecting mirror to be vibrated is effective.

That is to say, in order to realize both a broader range of tunable wavelength and faster wavelength tunability for tunable-wavelength VCSEL, the resonance frequency needs to be raised without raising the resonance frequency of the reflecting mirror.

The relation between spring constant and resonance frequency is as follows. The spring constant k and resonance frequency f of a reed-shaped cantilever can each be expressed as set forth in Expressions (1) and (2), $$k = \frac{w * d^3}{4 * l^3} E \quad (1)$$

$$f = 0.56 \frac{d}{l^2} \sqrt{\frac{E}{12\rho}} \quad (2)$$

where w represents the width of the cantilever, d represents the thickness thereof and l the length thereof, E the Young's modulus of the material of which the cantilever is formed, and ρ the density of this material.

It can be understood from the Expressions (1) and (2) above, that the resonance frequency can be increased without having a great spring constant by forming a thin and short cantilever. More specifically, the resonance frequency can be double without changing the spring constant by halving the length and thickness of the cantilever.

However, it is difficult to actually realize such a configuration with a common tunable-wavelength VCSEL.

FIG. 13 illustrates a schematic cross-sectional view of a common tunable-wavelength VCSEL. An active layer 1320 and a gap 1330 are provided between an upper reflecting mirror 1300 and a lower reflecting mirror 1310. Reference numerals 1360 and 1370 denote a first spacer layer and a second spacer layer, respectively.

Moving the upper reflecting mirror 1300 vertically as to the plane of the drawing in FIG. 13 changes the length of the gap 1330 (i.e., the distance between the upper reflecting mirror 1300 and the second spacer layer 1370), thereby changing the cavity length, so the laser oscillation wavelength can be changed.

A DBR having a multilayer configuration of a dielectric or semiconductor is commonly used as the reflecting mirrors, to obtain high reflectance necessary for laser oscillation.

A common DBR is formed by alternately laying two types of layers having different refractive indices, at ¼ wavelength in optical thickness. The refractive index of the DBR is decided by the refractive index difference of the two types of layers and the number of layers. The greater the necessary reflectance is, the greater the number of layers required.

In particular, in a case of forming a DBR using a semiconductor, which does not afford as great a refractive index difference as a dielectric, a great number of layers are needed to obtain a high reflectance required of a reflecting mirror in a VCSEL. Depending on the refractive index of the material, the thickness may be several microns or greater.

As described above, reducing the thickness of the DBRs is desirable from the perspective of raising the resonance frequency without raising the spring constant. Realizing a thinner DBR requires forming each layer making up the DBR thinner, or reducing the number of layers.

The thickness of each layer making up the DBR is designed so that the optical thickness is ¼ the optical wavelength. That is to say, the thickness of each layer is decided by the wavelength of the light to be reflected, and the refractive indices of the materials used, so these cannot be changed very much.

Reducing the number of layers of the DBR reduces the reflectance and leads to an increased laser oscillation threshold, so the number of layers of the DBR cannot be reduced very much.

Accordingly, in practice it is difficult to reduce the thickness of the DBR, and there is a limit to how far the resonance frequency can be increased without increasing the spring constant. Thus, it has been difficult with variable-length VCSELs according to the related art to realize both a broader range of tunable wavelength and faster wavelength tunability.

SUMMARY OF THE INVENTION

It has been found desirable to provide a new surface emitting laser by which the wavelength of emitted light can be changed without driving either of the upper reflecting mirror or lower reflecting mirror.

A surface emitting laser operable to change a wavelength of emitted light includes a first reflecting mirror, a second reflecting mirror, wherein a cavity is formed between the first reflecting mirror and the second mirror along the optical axis of the surface emitting laser, an active layer formed within the cavity, a region formed within the cavity, and a movable part situated within the region, the movable part having a refractive index different from a refractive index of the region. The wavelength of emitted light is changeable by changing the position of the movable part along the direction of the optical axis in the region.

Further features of the present invention will become apparent from the following description of embodiments with reference to the attached drawings. Each of the embodiments of the present invention described below can be implemented solely or as a combination of a plurality of the embodiments or features thereof where necessary or where the combination of elements or features from individual embodiments in a single embodiment is beneficial.

DESCRIPTION OF THE EMBODIMENTS

First Embodiment

Surface Emitting Laser

Figure 1:
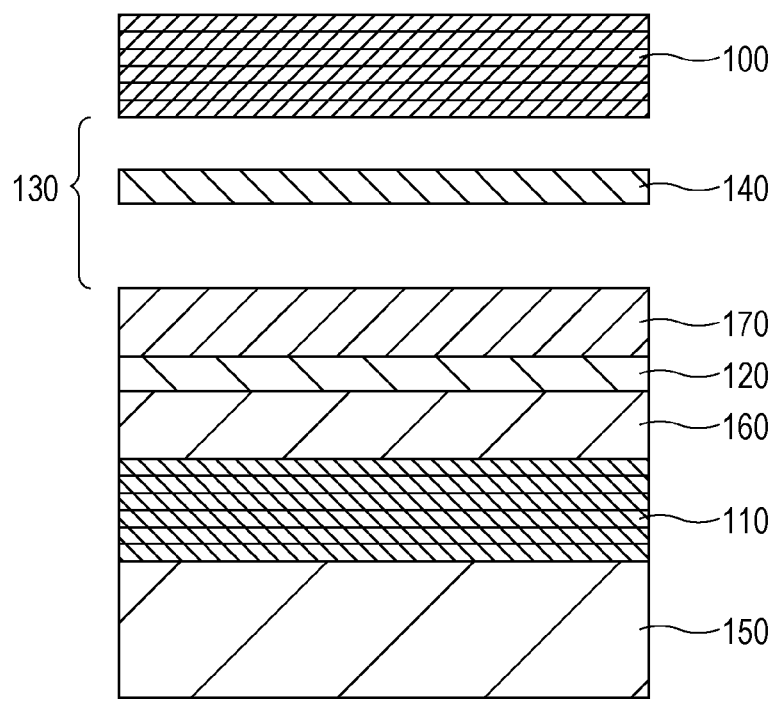
FIG. 1 is a schematic cross-sectional view of the configuration of a surface emitting laser according to a first embodiment of the present invention.

A tunable-wavelength surface emitting laser according to a first embodiment of the present invention, capable of changing the wavelength of emitted light, will be described with reference to FIG. 1. Note that in the present specification, the substrate side of the laser element will be defined as "bottom side" and the side opposite from the substrate as "top side". Also, in the present specification, the term "tunable wavelength laser" is not restricted to wavelength sweeping lasers where the wavelength is continuously changed over time, but also includes lasers where the wavelength is non-continuously changed over time, and lasers where the wavelength can simply be switched instead of the oscillation wavelength being changed. The present invention is suitably used in wavelength sweeping lasers due to the fast wavelength tunability.

In the present specification, the term "center wavelength" is used to mean the wavelength that is at the center of the wavelength range of the laser beam which the surface emitting laser can emit, i.e., the wavelength that is at the center between the shortest wavelength and the longest wavelength of which laser oscillation can be performed. Wavelengths of which laser oscillation can be performed are decided by the width of change of cavity length, reflection band of reflecting mirrors, gain band of the active layer, and so forth. When designing, basically the center wavelength is set, and the configurations of the components are determined around that.

In the present specification, the direction in which light resonating in the resonator, i.e., the direction perpendicular to the substrate and active layer faces, is defined as the optical axis direction. The surface emitting laser according to the present embodiment includes a lower reflecting mirror 110 formed of a DBR, an active layer 120, a gap (or region) 130, and an upper reflecting mirror 100 formed of a DBR, in that order. A first spacer layer 160 is disposed between the lower reflecting mirror 110 and the active layer 120, and a second spacer layer 170 is disposed between the active layer 120 and gap 130.

A feature of the present embodiment is that a movable part 140 having a different refractive index from the refractive index of the gap 130 is disposed in the optical path in the gap 130 of the surface emitting laser. Although, the gap 130 is herein referred to as a gap, it may simply be considered to be a region (130) where the movable part (140) is located, and within which the movable part (140) can be moved along the optical axis of the surface emitting laser. The resonator, or cavity, of the surface emitting laser according to the present embodiment is formed of the upper reflecting mirror 100 and lower reflecting mirror 110. More particularly, in the case illustrated in FIG. 1, the resonator is formed between the interface between the upper reflecting mirror 100 and gap 130 on the optical axis, and the interface between the lower reflecting mirror 110 and first spacer layer 160 on the optical axis. An optical cavity is thus formed between upper reflecting mirror and the lower reflecting mirror. The optical path length of this resonator is called "cavity length".

The position of the movable part 140 along the optical axis in the gap 130 is changed so as to be reciprocally moved in the optical axis direction between the upper reflecting mirror 100 and second spacer layer 170. Unlike the related art, the upper reflecting mirror 100 and lower reflecting mirror 110 do not move so there is no visible change in cavity length, but providing the movable part 140, having a refractive index different from that of the gap 130, in the optical path in the gap 130, changes the effective cavity length. The effective cavity length changes depending on the position of the movable part 140 which can be used to change the laser oscillation wavelength. The position of the movable part 140 is changed by a drive unit omitted from illustration.

The movable part 140 is formed so as to be thinner in the optical axis direction as compared to the upper reflecting mirror 100 and also thinner that than the lower reflecting mirror 110 in the optical axis direction, so the resonance frequency can be raised without increasing the spring constant, as described above. That is to say, both a broader range of tunable wavelength and faster wavelength tunability can be realized without changing the configuration of the upper reflecting mirror and lower reflecting mirror.

Forming the movable part 140 so that the weight thereof is smaller than the upper reflecting mirror 100 and smaller than the weight of the lower reflecting mirror 110 allows the position of the movable part 140 to be changed faster than changing the position of the upper reflecting mirror 100 or the lower reflecting mirror 110. The result is a faster wavelength tunability. For example, forming the movable part 140 of a material having smaller density than that of the upper reflecting mirror 100 and lower reflecting mirror 110 allows the position of the movable part 140 to be changed quickly, even if the movable part 140 is thicker than the upper reflecting mirror 100 and lower reflecting mirror 110.

If the center wavelength of the wavelength range of beams which the surface emitting laser can emit is one wavelength, the cavity length formed of the upper reflecting mirror 100 and lower reflecting mirror 110 is preferably ten wavelengths or less, and more preferably three wavelengths or less.

Principle of Wavelength Tunability

Figure 2:
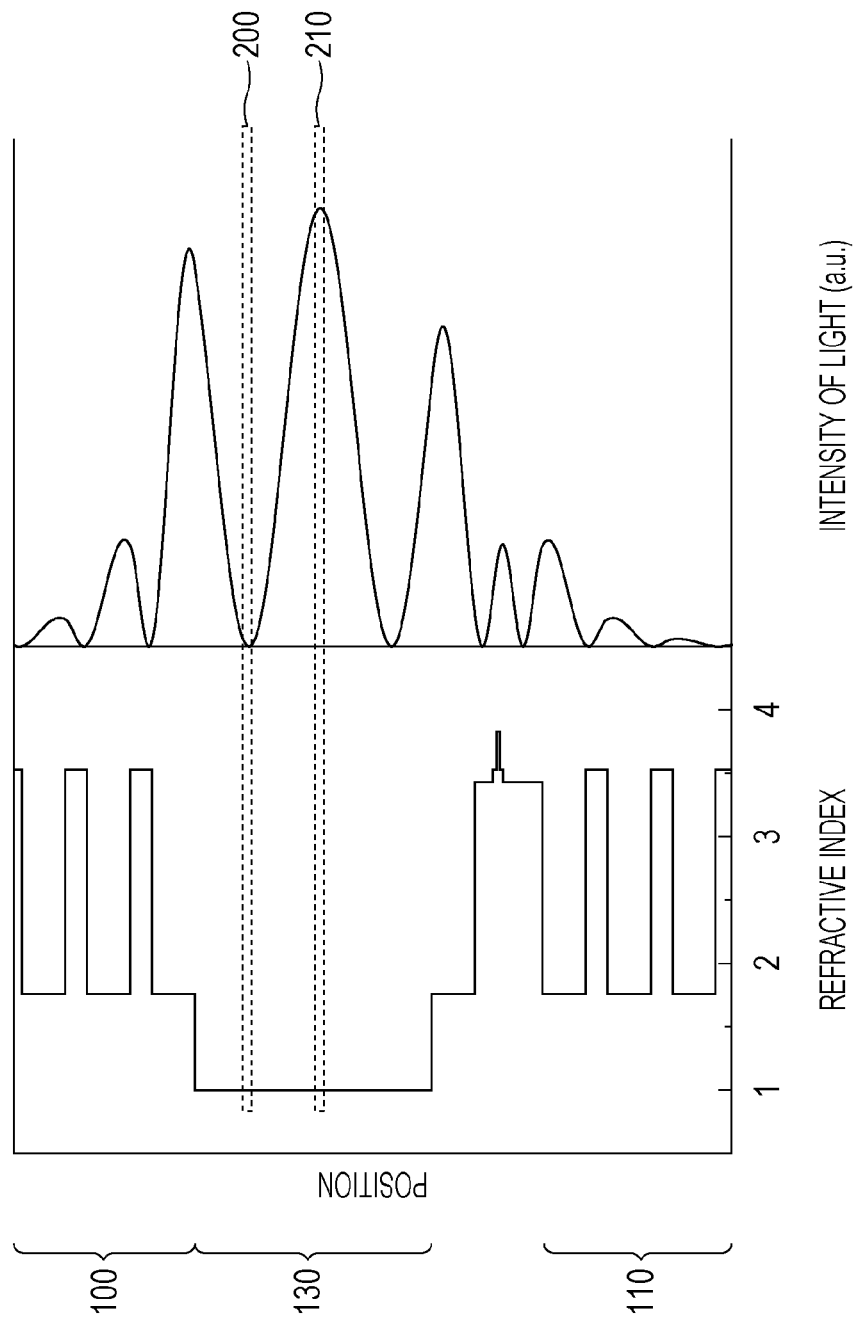
FIG. 2 is a graph for describing the principle of wavelength tunability of the surface emitting laser according to the first embodiment of the present invention.

A qualitative description will be made regarding the principle of surface emitting laser wavelength tunability according to the present embodiment, with reference to the graph illustrated in FIG. 2.

The left half of the graph represents an example of refractive index distribution of the VCSEL structure where the gap 130 is sandwiched between the upper reflecting mirror 100 formed of a DBR and the lower reflecting mirror 110 also formed of a DBR. The right half of the graph represents an example of results of calculating light intensity distribution in the resonance wavelength of the VCSEL structure. We will now consider a case of inserting a movable part in the gap 130. Let us consider a case of inserting the movable part into the gap of this structure.

If a movable part is inserted at a position 200, which is a node of the light distribution, interaction between the light and movable part is weak, so the light is not affected by the movable part very much, and effective change in cavity length due to having inserted the movable part is small.

On the other hand, if the movable part is inserted at a position 210, which is an antinode of the light distribution, interaction between the light and movable part is strong, so the light is greatly affected by the movable part, and effective cavity length changes greatly.

That is to say, the effective resonance length can be changed depending on the position in the gap 130 where the movable part is placed, and by appropriately controlling the position of the movable part, the laser oscillation wavelength can be controlled.

Note that this effect does not occur if the refractive index of the movable part situated in the gap 130 is the same as the background refractive index in the gap. Accordingly, the refractive index of the movable part and the background in the gap 130 need to be different. Moreover, the movable part needs to be situated in the region of the gap 130 where the light passes, i.e., on the optical path.

Movable Part

The movable part to be provided in the gap in the surface emitting laser according to the present embodiment is not restricted in particular, as long as the refractive index thereof is different from that of the gap. The structure of the gap is not restricted in particular either, and a structure easily fabricated by the manufacturing method being used may be used. For example, in a case of forming the gap by epitaxial growth and selective wet etching, the movable part situated therein is preferably a slab, the term "slab" in the present embodiment meaning a thin plate shape.

The suitable range of refractive index of the movable part in the present embodiment depends on the thickness of the movable part, but a greater refractive index is preferable, since the wavelength tunable range is greater.

The form of the movable part may be designed in accordance with the necessary displacement amount and resonance frequency.

The thickness and length of the cantilever may be decided by calculation fitting the material density and Young's modulus into the above Expressions (1) and (2).

The optical thickness of the movable part is preferably within a range of ¼±20% of the center wavelength of the wavelength range of beams which the surface emitting laser can emit, and more preferably within a range of ¼±10%, which will be illustrated in later-described embodiments.

$Al_xGa_{(1-x)}As$ (where x is a number no less than 0 and no more than 1) is an example of a material which can be used to form the movable part according to the present embodiment.

When using a mixture of an aqueous solution of citric acid and a hydrogen peroxide solution as the etchant to perform selective wet etching of $Al_xGa_{(1-x)}As$, the lower the Al composition is, the more readily the material is dissolved. This can be used to form the sacrifice layer which will later become the gap of GaAs, and the layer to become the movable part of $Al_xGa_{(1-x)}As$ after etching, where x is 0.5 or greater, for example.

When using buffered hydrofluoric acid as the etchant, the higher the Al composition is, the more readily the material is dissolved. This can be used to form the sacrifice layer which will later become the gap of $Al_xGa_{(1-x)}As$ where x is 0.8 or greater, and the layer to become the movable part of $Al_xGa_{(1-x)}As$ where x is 0.5 or smaller, for example.

Upper Reflecting Mirror and Lower Reflecting Mirror

The upper reflecting mirror and lower reflecting mirror in the surface emitting laser according to the present embodiment are not restricted in particular, as long as reflectance sufficient for laser oscillation can be obtained. Using a DBR, a DBR with a great number of layers in particular, for at least one of the upper reflecting mirror and lower reflecting mirror is preferable, since the reflectance is high and the laser oscillation threshold can be kept low.

It is difficult to raise the resonance frequency without raising the spring frequency using thick reflecting mirrors with many layers like a DBR according to the reflecting mirror driving method of the related art. In comparison, the advantages of the surface emitting laser according to the present embodiment are notable.

The upper reflecting mirror and lower reflecting mirror may be high contrast grating (HCG) mirrors. An HCG mirror has a configuration where a material with high refractive index and a material with low refractive index are cyclically arrayed alternately in the in-plane direction. An example of an HCG mirror is a configuration where a material with high refractive index is cyclically provided on a layer with low refractive index, for example.

It should also be noted that the structures of the upper reflecting mirror and the lower reflecting mirror according to the present embodiment may be selected independently of each other.

In the present embodiment, the forms of the upper reflecting mirror, lower reflecting mirror, and movable part, when viewed from above, are not restricted in particular. The upper reflecting mirror or lower reflecting mirror may be the same form as the movable part, the upper reflecting mirror or lower reflecting mirror may be larger than the movable part, or conversely the movable part may be larger than the upper reflecting mirror or lower reflecting mirror.

Further, the upper reflecting mirror, lower reflecting mirror, and movable part may each partly overlap.

Active Layer

The active layer in the present embodiment may be the same as that used in a common surface emitting laser. The composition of the active layer can be selected as appropriate in accordance with the wavelength desired to be emitted. Examples of materials which can be used for the active layer include $Al_xGa_{(1-x)}As$ (where x is a number no less than 0 and no more than 1) and $In_yGa_{(1-y)}As$ (where y is a number no less than 0 and no more than 1). Further, a so-called periodic gain structure where multiple active layers have been disposed in accordance with the light distribution may be used.

Electric current may be injected to the active layer from electrodes omitted from illustration. The positions of the electrodes are not restricted in particular as long as a current can be injected to the active layer. On example of the positions is at the interface between the first spacer layer and the gap, and on the bottom side of the substrate.

The active layer according to the present embodiment may have a quantum well layer, or may have multiple quantum well layer.

Gap

The gap, or region, according to the present embodiment is normally made up of air, but may be made up of other gasses, or liquid, or a vacuum, as long as oscillation of light of the desired wavelength is emitted by the surface emitting laser according to the present embodiment.

If the movable portion according to the present embodiment which is situated in the gap is thin, air resistance encountered while vibration is not negligible, and cases can be conceived where high-speed vibration is difficult. In such cases the region of the moving part can be made into a vacuum state, and more preferably the gap can be made into a vacuum state, thereby reducing air resistance and enabling further high-speed vibrations. Note that the term "vacuum" as used here refers to a state where air pressure is a negative pressure, lower than the standard atmosphere. Also, the gap may be filled with a gas having a smaller molecular weight than the average molecular weight of air, such a helium gas, so as to reduce air friction.

First Spacer Layer and Second Spacer Layer

The first spacer layer according to the present embodiment may be formed of $Al_xGa_{(1-x)}As$ (where x is a number no less than 0 and no more than 1). The first spacer layer serves to adjust the optical path length between the lower reflecting mirror and active layer. Adjustment of the optical path length is performed by changing the layer thickness and the refractive index decided by the value of x described above. The second spacer layer according to the present embodiment may be formed of $Al_xGa_{(1-x)}As$ (where x is a number no less than 0 and no more than 1). The second spacer layer serves to adjust the optical path length between the upper reflecting mirror and active layer. Spacer layers are sometimes referred to as "clad layers".

In the present embodiment, a current constriction layer including an oxidized region and non-oxidized region may be provided to the first or second spacer layer. When the current constriction layer is provided, current injected from the electrodes cannot flow into the oxidized region which has taken on insulating properties due to having been oxidized, and accordingly is concentrated in the conducting non-oxidized region. Concentrating the injected current in a narrow region at the middle by this current constriction structure enables laser oscillation of the surface emitting laser to occur with a low injection current, while also realizing single transverse mode oscillation. An AlGaAs layer with Al composition of 0.95 or more, for example, may be used to form the non-oxidized region.

Driving Unit

Technology commonly used in the field of microelectromechanical systems (MEMS) may be used for the driving unit to vertically drive the movable part situated in the gap in the present embodiment. A driving unit which uses static electricity, voltage, heat, electromagnetism, fluid pressure, or the like, for example, may be used to drive the movable part.

Second Embodiment

Figure 3:
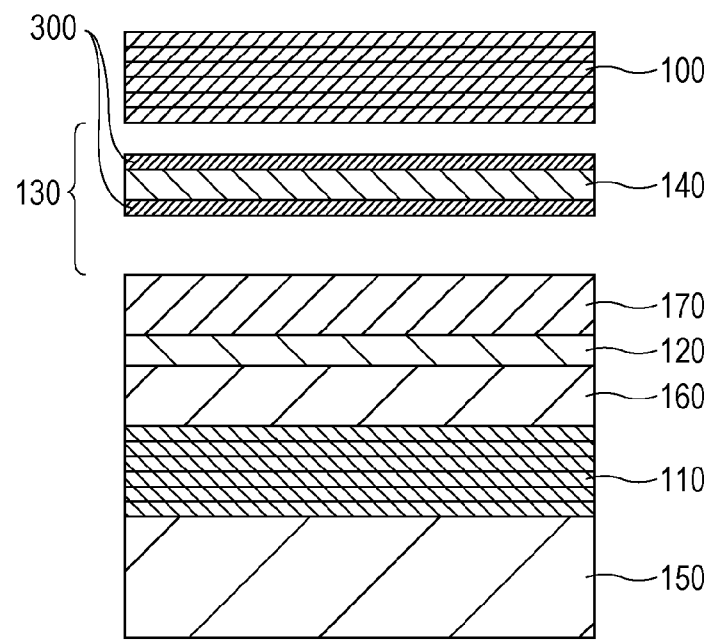
FIG. 3 is a schematic cross-sectional view of the configuration of a surface emitting laser according to a second embodiment of the present invention.

A surface emitting laser according to a second embodiment will be described with reference to FIG. 3. Matter that differs from the first embodiment will be described, and description of common matter will be omitted.

The present embodiment includes an anti reflection film 300 formed on both sides in the optical axis direction of the movable part 140 in the gap 130. The anti reflection film 300 has a smaller refractive index than that of the movable part 140.

In a case where reflection of light at the surface of the movable part 140 is too strong, the movable part 140 may act as a reflecting mirror itself and form a composite resonator, resulting in the surface emitting laser exhibiting complicated optical properties. The present embodiment is configured including the anti reflection film 300 formed on the surface of the movable part 140, thus reducing reflection of light at the surface of the movable part 140, thereby suppressing formation of the composite resonator. While FIG. 3 illustrates the anti reflection film 300 formed on both faces of the movable part 140 in the optical axis direction, an arrangement may be made where the anti reflection film 300 is provided to one side of the movable part 140 or the other.

Third Embodiment

Figure 4:
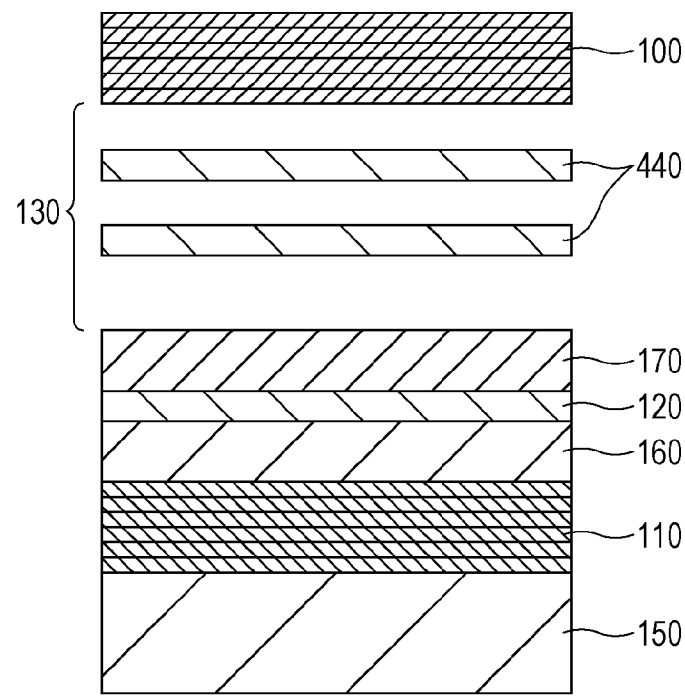
FIG. 4 is a schematic cross-sectional view of the configuration of a surface emitting laser according to a third embodiment of the present invention.

A surface emitting laser according to a third embodiment will be described with reference to FIG. 4. Matter that differs from the first embodiment will be described, and description of common matter will be omitted.

The present embodiment is configured having two movable parts 440 disposed in the gap 130, and all other configurations are the same as those of the first embodiment. Providing two movable parts 440 in the gap 130 enables a broader wavelength tunability as compared with the configuration of providing just one. To briefly state the reason, situating the moving part at the antinode or node of the light distribution in the resonator does enable the effective cavity length to be changed, as described with reference to FIG. 2, but one moving part can only be placed at one antinode or node position at the same time. On the other hand, multiple movable parts can be placed at multiple positions at the same time. Consequently, the effects of the multiple movable parts are compounded, and the wavelength tunability can be further widened as compared to a case of just one movable part.

The number of movable parts disposed in the gap when providing multiple movable parts is not restricted to two. Three or more movable parts may be provided.

In a case of providing multiple movable parts, the movable parts may each be driven independently, or may be drivable with the distance therebetween fixed. An advantage of enabling driving independently is that each of the movable parts can be situated at optimal positions. For example, when the laser oscillation wavelength is changed the intervals of antinodes of the light distribution in the resonator change, so the movable parts can each be situated accordingly. On the other hand, driving the movable parts with the distance therebetween fixed does not allow such optimal placement, but a single driving unit can be used so the configuration is simple, which is advantageous from a practical perspective.

The configurations of the multiple movable parts may be the same, or may be different. In a case where three or more movable parts are used, some of the three or more movable parts may be the same.

Usage

The surface emitting laser according to the first through third embodiments described above may be used as a light source for a measuring apparatus such as an OCT apparatus, or the like.

Multiple surface emitting laser elements according to the first through third embodiments may be arrayed on a plane, to form a light source array.

The change in position of movable parts of the surface emitting laser according to the first through third embodiments is reflected in the laser oscillation wavelength. This means that conversely, the change in position of the movable parts can be detected from change in the laser oscillation wavelength. Accordingly, the surface emitting laser according to the first through third embodiments can also be used as a position sensor to detect change in position of the movable parts in the resonator.

Optical Coherence Tomography (OCT) Measuring Apparatus

Figure 5:
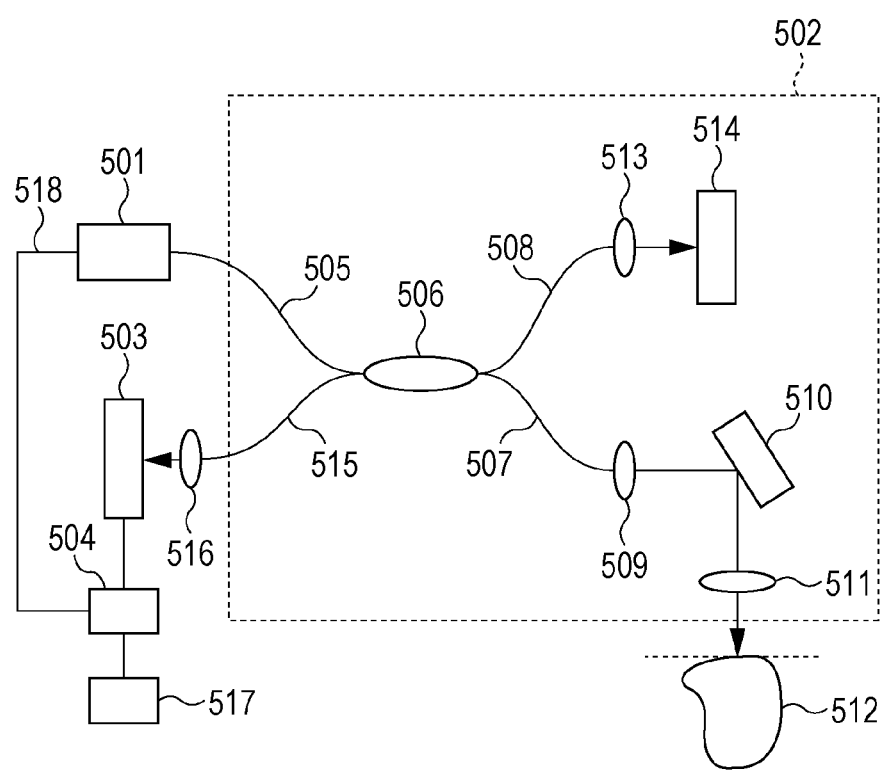
FIG. 5 is a diagram for describing an OCT using the surface emitting laser according to an embodiment of the present invention.

An example of applying the surface emitting laser according to the first through third embodiments to OCT will be described with reference to FIG. 5.

An OCT apparatus according to the present example includes at least a light source unit 501, an interference optical system 502, a light detecting unit 503, and an information obtaining unit 504. The light source unit 501 is the surface emitting laser according to the embodiments described above. Although omitted from illustration, the information obtaining unit 504 includes a Fourier transformer. The manner in which the Fourier transformer is included is not restricted in particular, as long as the information obtaining unit 504 has a function to perform Fourier transform on input data. As one example, the information obtaining unit 504 may include a computing unit and the computing unit performs Fourier transform. More specifically, an arrangement may be made where the computing unit is a computer including a central processing unit (CPU), and software having a Fourier transform function has been installed in this computer. Another example is including a Fourier transform circuit in the information obtaining unit 504. Light emitted from the light source unit 501 becomes interference light at the interference optical system 502, having information of an object 512 to be measured, and is output. The interference light is received at the light detecting unit 503. The light detecting unit 503 may be a difference detecting type or simple intensity monitor type. Temporal waveform information of the intensity of the received interference light is transmitted from the light detecting unit 503 to the information obtaining unit 504. The information obtaining unit 504 obtains the peak value of the temporal waveform information of the intensity of the received interference light, performs Fourier transform, and obtains information of the object 512 (i.e., tomography image information). Components other than the light source unit 501, interference optical system 502, light detecting unit 503, and information obtaining unit 504 described here may also be provided optionally.

Next, oscillation of light from the light source unit 501 through obtaining of tomography image information of the object to be measured, will be described in detail.

Light which has been emitted from the light source unit 501, which changes the wavelength of light passes through an optical fiber 505 and enters a coupler 506, and is branched into irradiation light which passes through an irradiation light fiber 507, and reference light which passes through a reference light fiber 508. The coupler 506 is a single mode coupler at the wavelength band of the light source. Various types of fiber couplers may be configured using 3 dB couplers. Irradiated light passes through a collimator 509 to become parallel light, which is reflected at a mirror 510. The light reflected at the mirror 510 passes through the lens 511 and is irradiated onto the object 512, and is reflected from each layer of the object 512 in the depth direction thereof. On the other hand, the reference light passes through a collimator 513 and is reflected at a mirror (or reference surface) 514. Interference light is generated at the coupler 506, due to interference between the reflected light from the object 512 and the reflected light from the mirror 514. The interfering light passes through a fiber 515, is collected through a collimator 516, and is received at the light detecting unit 503. Information of the intensity of interference light received at the light detecting unit 503 is converted into electrical information such as voltage, and transmitted to the information obtaining unit 504. The information obtaining unit 504 performs Fourier transform of the intensity data of interference light, and obtains tomography image information. The intensity data of interference light to be subjected to Fourier transform is normally data sampled at equal wavenumber intervals, but data sampled at equal frequency intervals may be used.

The obtained tomography image information may be transmitted from the information obtaining unit 504 to an image display unit 517 and displayed as an image. Note that a three-dimensional tomography image of the object 512 to be measured is obtained by scanning the mirror 511 on a plane perpendicular to the direction of incident irradiation light. The information obtaining unit 504 may perform control of the light source unit 501 through an electric circuit 518. An arrangement may also be made where, though omitted from illustration, the intensity of light output from the light source unit 501 is monitored as appropriate, and the data is used for amplitude correction of the interference light intensity signals.

OCT according to the present example uses the surface emitting laser according to the above-described first through third embodiments as the light source unit 501. Accordingly, a broad wavelength tunable range can be obtained, and wavelength tunability is fast. Accordingly, OTC can be provided of which depth resolution is high, and tomography images can be quickly obtained.

Detailed Embodiments

Detailed embodiments of the present invention will now be described. It should be noted that the present invention is not restricted to the configurations of detailed embodiments described below. For example, types and compositions of materials, shapes, and sizes, can be changed as appropriate, within the scope of the present invention. The result of calculation in each exemplary embodiment below was obtained by calculating electromagnetic field distribution in each resonant cavity by considering boundary condition of Maxwell equations and using Transfer-matrix method.

While description will be made hereinafter regarding laser oscillation wavelengths around 850 nm and 1060 nm in the following detailed embodiments, arrangements may be made to operate at optional wavelengths by selecting appropriate materials and structures.

First Detailed Embodiment

A surface emitting laser according to a first detailed embodiment will be described. The surface emitting laser according to the present detailed embodiment has the configuration of the first embodiment illustrated in FIG. 1.

The surface emitting laser according to the present detailed embodiment is designed to change wavelength around a center wavelength of 850 nm. More specifically, on a GaAs substrate 150 are formed a lower DBR 110 serving as a lower reflecting mirror, an active layer 120, a gap 130, a movable part 140, and an upper DBR 100 serving as an upper reflecting mirror.

The cavity length is two wavelengths worth, with the center wavelength 850 nm as one wavelength.

The upper DBR 100 is a laminate, 905 nm thick, that has been configured by laminating five pairs of $Al_{0.15}Ga_{0.85}As$ and AlAs oxide alternately.

The lower DBR 110 is a laminate, 1267 nm thick, that has been configured by laminating seven pairs of $Al_{0.15}Ga_{0.85}As$ and AlAs oxide alternately. The optical film thickness of each layer of the upper and lower DBRs is formed to be ¼ of the center wavelength.

The active layer 120 is formed of $In_{0.08}Ga_{0.92}As$ to a thickness of 8 nm.

A slab-shaped movable part 140 formed of $Al_{0.30}Ga_{0.70}As$ to a thickness of 60 nm is disposed within the gap 130, and is arranged so as to be vertically movable by electrostatic force under application of voltage. The thickness of the movable part 140 is around ¼ the center wavelength. The first detailed embodiment was designed so that the refractive index of the movable part 140 is 3.43.

Air is present in the gap 130. The thickness of the gap 130 in the optical axis direction is configured such that the thickness of the air portion excluding the thickness of the movable part 140 is 600 nm.

The configuration according to the present detailed embodiment can be formed by epitaxial growth and selective wet etching. The portion to serve as the gap is formed by depositing a sacrifice layer of GaAs when performing epitaxial growth.

Using a mixture of an aqueous solution of citric acid and a hydrogen peroxide solution as the etchant enables selective wet etching according to the Al composition of AlGaAs.

In the case of the present detailed embodiment, a mixture obtained by mixing an aqueous solution of citric acid containing equal amounts by weight of water and citric acid and water, and a hydrogen peroxide solution of a 30% concentration, at a ratio of 2:1, is used as the etchant. This concentration enables the selectivity of etching rates of the GaAs layer and the $Al_{0.30}Ga_{0.70}As$ layer to be sufficiently great. Accordingly, the gap 130 and movable part 140 can be formed by removing the GaAs sacrifice layer while leaving the movable part 140.

Figure 6:
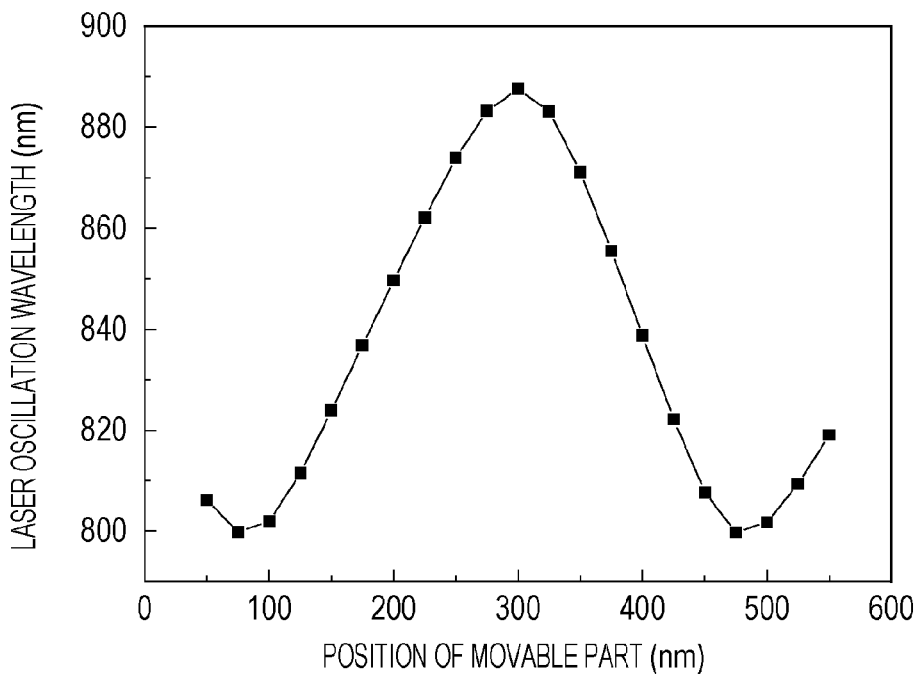
FIG. 6 is a graph illustrating results of calculating oscillation wavelength of a surface emitting laser according to a first detailed embodiment of the present invention.

FIG. 6 illustrates the results of calculating the oscillation wavelength of the surface emitting laser according to the present detailed embodiment. Note that these calculations have been made assuming that the active layer yields a constant gain regardless of wavelength, to compare the resonator properties alone.

The horizontal axis of the graph in FIG. 6 represents the position of the movable part, and the vertical axis represents the laser oscillation wavelength. The lowest position in the gap 130, i.e., the face of contact between the movable part 140 and the second spacer layer 170 is set as the point of origin, and the position of the movable part is defined upwards therefrom, i.e., toward the position of the upper reflecting mirror.

When the movable part 140 is moved from a position 100 nm from the lowest position of the gap 130, to a position 300 nm thereabove, the laser oscillation wavelength can be changed from 802 nm to 888 nm.

Thus, the laser oscillation wavelength continuously changes in accordance with the position of the movable part 140, and accordingly it has been confirmed that the surface emitting laser to which the present invention has been applied operates as a tunable-wavelength laser. Also, the movable part 140 is extremely thin as compared to the upper reflecting mirror and lower reflecting mirror, and also light, so the movable part 140 can be moved at high speed. Accordingly, the surface emitting laser to which the present invention has been applied can change wavelengths speedily and over a broad range.

Second Detailed Embodiment

Configuration Having Anti Reflection Film on Both Faces of Movable Part

A surface emitting laser according to a second detailed embodiment will be described. The surface emitting laser surface emitting laser according to the present detailed embodiment has the configuration of the second embodiment illustrated in FIG. 3.

The surface emitting laser according to the present detailed embodiment has anti reflection films 300 on both faces of the movable part 140 in the axial direction. Both of the two anti reflection films 300 are formed of $Al_{0.80}Ga_{0.20}As$, which has a higher Al composition than the movable part 140. Other configurations are the same as with the first embodiment.

Forming the anti reflection films 300 on the faces of the movable part 140 reduces reflected light at the faces of the movable part 140, thereby suppressing formation of a composite resonator according to the present detailed embodiment.

Third Detailed Embodiment

Configuration Having Multiple Movable Parts

A surface emitting laser according to a third detailed embodiment will be described. The surface emitting laser according to the present detailed embodiment has the configuration of the third embodiment illustrated in FIG. 4, having multiple movable parts. The cavity length is four wavelengths worth.

The thickness of the gap 130 in the present detailed embodiment was increased by one wavelength worth (850 nm) as compared to that in the first embodiment, and two to four movable parts 140 the same as that used in the gap 130 in the first embodiment were provided, and the distance between the movable parts was fixed at 350 nm in the optical axis direction. Other configurations are the same as with the first embodiment.

Figure 7:
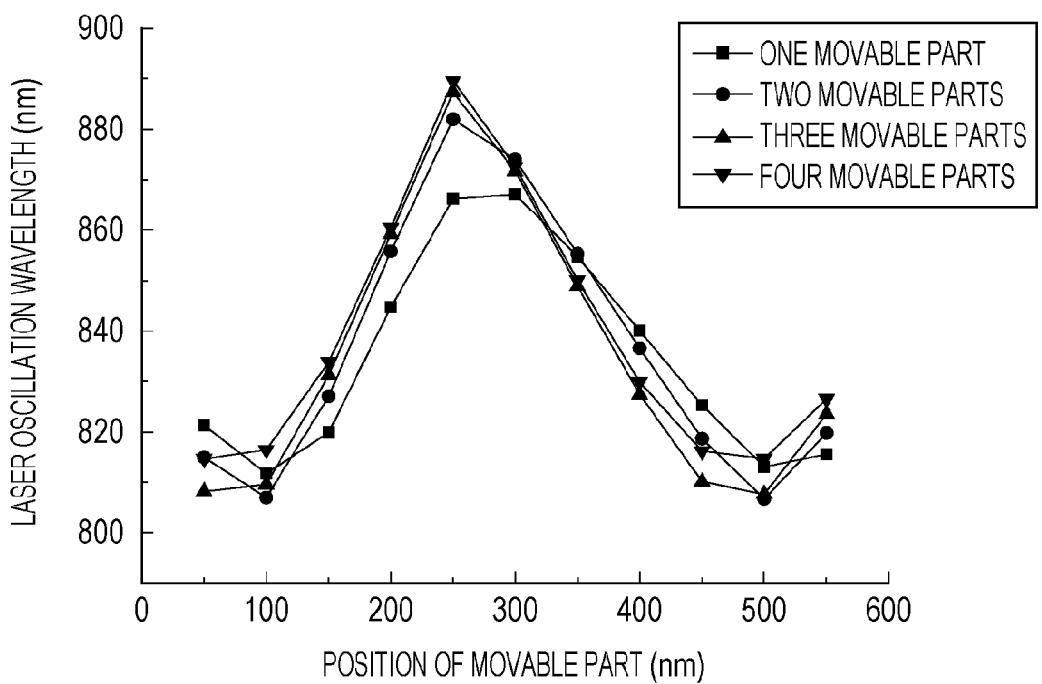
FIG. 7 is a graph illustrating results of calculating oscillation wavelength of a surface emitting laser according to a third detailed embodiment of the present invention.

FIG. 7 illustrates calculation results of change in oscillation wavelength in a case of providing one to four movable parts in a cavity length of four wavelengths. It can be understood that the wavelength tunability is broader by having multiple movable parts as compared to having one movable part. The horizontal axis labeled movable part position represents the position of the lower face of the movable part closest to the substrate, out of the multiple movable parts.

We can see from the graph in FIG. 7 that the wavelength tunability width is 50.3 nm when the number of movable parts is one, 68.4 nm when two, 72.4 nm when three, and 68.2 nm when four.

These results confirm that the wavelength tunability is broader by providing multiple movable parts in the gap as compared to having one movable part.

Fourth Detailed Embodiment

Tunable-Wavelength Configuration Having Center Wavelength Around 1060 nm

A surface emitting laser according to a fourth detailed embodiment will be described. The VCSEL according to the present detailed embodiment has been designed so as to be wavelength tunable around a center wavelength of 1060 nm. The surface emitting laser according to this detailed embodiment is overall the same as the configuration illustrated in the first detailed embodiment illustrated in FIG. 1.

There are four points that differ; that the active layer 120 is formed of $In_{0.30}Ga_{0.70}As$, that the thickness of the slab-shaped movable part 140 in the optical axial direction is 80 nm, that the thickness of the air portion of the gap 130 excluding the movable part 140 is 950 nm, and that the optical thicknesses of the layers making up the upper DBR 100 and lower DBR 110 is ¼ of the center wavelength of 1060 nm.

Figure 8:
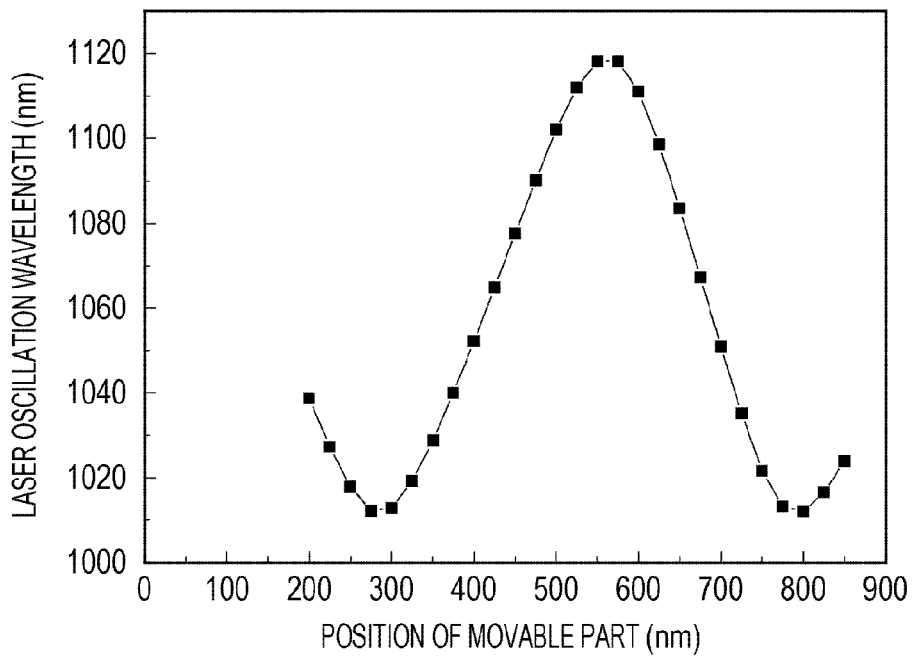
FIG. 8 is a graph illustrating results of calculating oscillation wavelength of a surface emitting laser according to a fourth detailed embodiment of the present invention.

FIG. 8 illustrates a case of change in the laser oscillation wavelength when the position of the movable part 140 is changed in the configuration according to the present detailed embodiment. The definition of moving position is the same as with the first detailed embodiment.

When the movable part 140 is moved from a position 300 nm from the lowest position of the gap 130, to a position 550 nm above the bottommost position of the gap 130, the laser oscillation wavelength of this configuration can be changed from 1012 nm to 1118 nm.

Fifth Detailed Embodiment

Configuration with Changed Refractive Index of Movable Part

The surface emitting laser according to the fifth detailed embodiment will be described. The surface emitting laser according to the present detailed embodiment is overall the same as the configuration of the surface emitting laser according to the first detailed embodiment, but differs with regard to the point that the refractive index of the movable part 140 has been changed to 3.0, 3.5, and 4.0, and that the thickness of the movable part 140 has been changed.

Figure 9:
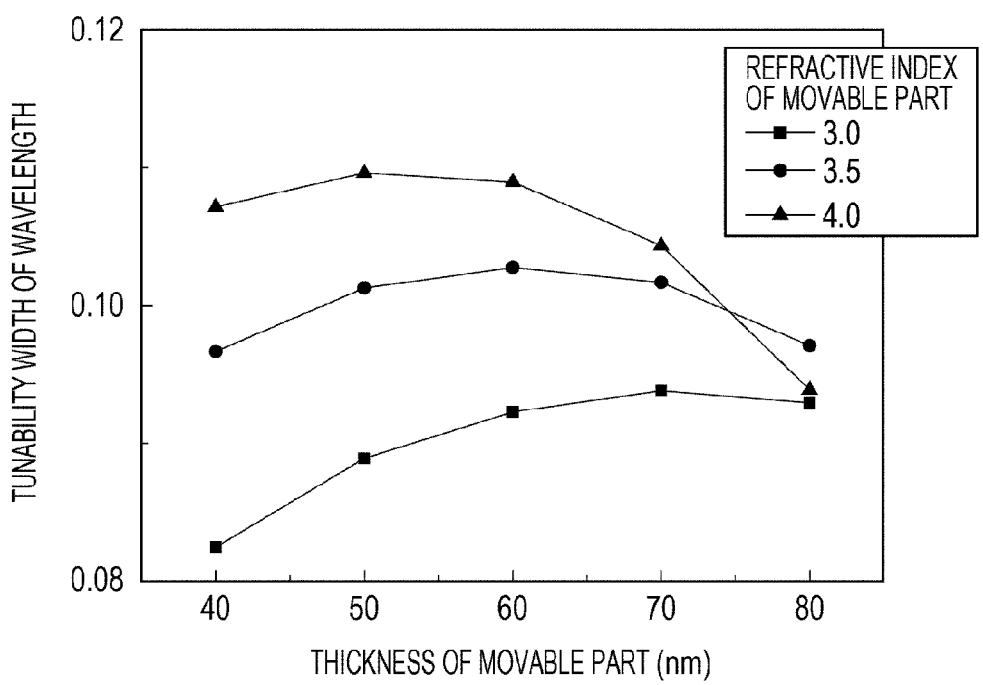
FIG. 9 is a graph illustrating change in wavelength tunable range when the refractive index of a movable part is changed in a surface emitting laser according to a fifth detailed embodiment of the present invention.

FIG. 9 illustrates results of having calculated the relation between the refractive index of the movable part and the width of wavelength tunability.

The width of wavelength tunability which is the vertical axis of the graph in FIG. 9 is expressed in terms of a standardized value, obtained by dividing the difference between highest and lowest values of laser oscillation wavelength changing as the movable part 140 is moved vertically, by the center wavelength.

Two things can be seen from the calculation results in FIG. 9. One is that the higher the refractive index of the movable part 140 is, the greater the width of the wavelength tunability is. This can be understood that the greater the refractive index difference between the medium in the gap 130 (air in this case) and the movable part 140 is, the greater the influence of change in positional relation is.

The second is that the thickness of the movable part which can maximize the width of the wavelength tunability is dependent on the refractive index of the movable part. When the refractive index of the movable part 140 is 3.0, the wavelength tunability is greatest when the thickness of the movable part 140 is 70 nm, when the refractive index is 3.5, at thickness of 60 nm, and when the refractive index is 4.0, at thickness of 50 nm. This indicates that when designing the thickness of the movable part 140, the optical thickness obtained by multiplying the actual thickness (thickness of the movable part) by the refractive index is important.

According to these calculation results, the optimal optical thickness of the movable part 140 is around 210 nm. This is a value about ¼ of the center wavelength.

Also, we can see that the width of wavelength tunability suddenly drops from ±20% or so away from the optimal thickness in each. Accordingly, the optical thickness of the movable part 140 preferably is within a range of ¼±20% of the center wavelength of the wavelength range of light which the surface emitting laser can emit, and more preferably within a range of ¼±10% of the center wavelength. In other words, an optical thickness nd of the movable part 140 is preferably expressed by the following Expression (3) where $\lambda_0$ is the center wavelength of the wavelength range of light which the surface emitting laser according to the present embodiment can emit, and more preferably, Expression (4).

$$\lambda_0/4 \times 0.8 \leq nd \leq \lambda_0/4 \times 1.2 \quad (3)$$

$$\lambda_0/4 \times 0.9 \leq nd \leq \lambda_0/4 \times 1.1 \quad (4)$$

Sixth Detailed Embodiment

Configuration with Changed Cavity Length

Figure 10A:
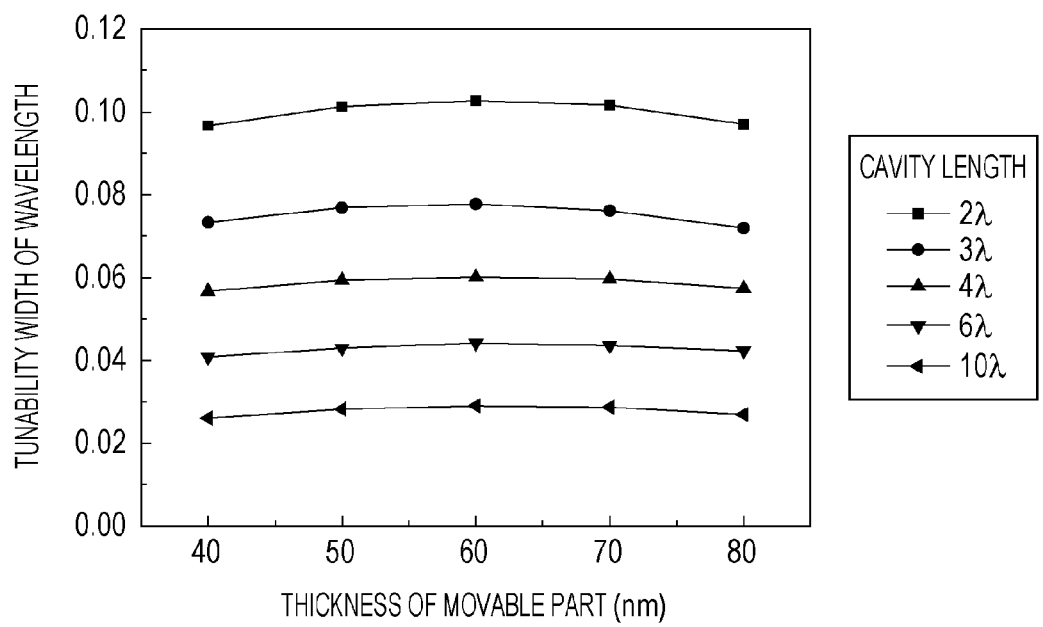
FIGS. 10A and 10B are graphs illustrating change in wavelength tunable range when the resonance length is changed in a surface emitting laser according to a sixth detailed embodiment of the present invention.
Figure 10B:
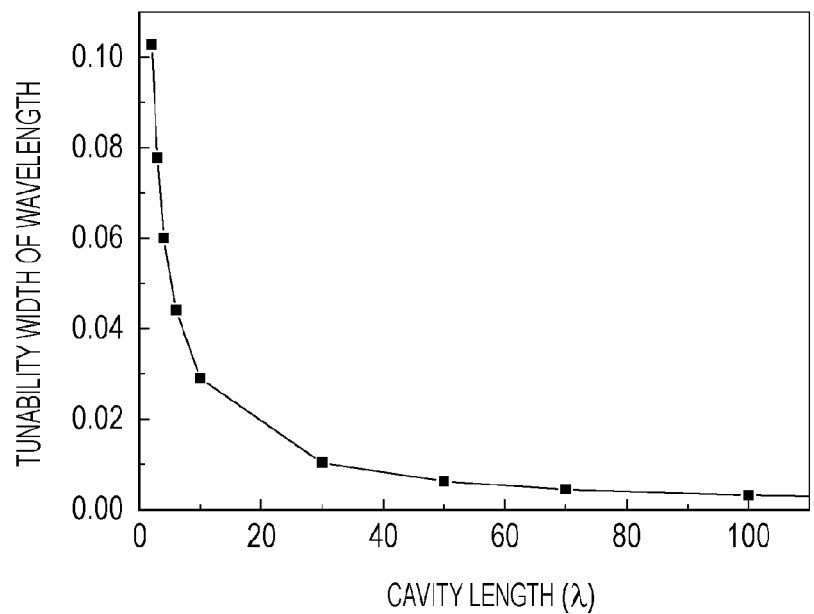

FIG. 10A illustrates results of having calculated the width of wavelength tunability while changing the cavity length (λ) in a VCSEL structure the same as that illustrated in FIG. 1, designed where the wavelength can be changed around the center wavelength of 850 nm. The width of wavelength tunability which is the vertical axis in the graphs in FIGS. 10A and 10B is expressed in terms of a standardized value, obtained by dividing the difference between highest and lowest values of laser oscillation wavelength changing as the movable part 140 is moved vertically, by the center wavelength. The refractive index of the movable part 140 was set to 3.5. Two things can be seen from the calculation results in FIG. 10A.

One is that the thickness of the movable part 140 where the width of wavelength tunability can be made widest, regardless of the cavity length, is 60 nm. This indicates that the optimal thickness of the movable part does not change even if the cavity length changes. It is thought that this is because the optimal thickness of the movable part is determined in relation to the wavelength.

The second is that the longer the cavity length is, the narrower the width of wavelength tunability becomes. FIG. 10B illustrates the results of plotting the relationship between cavity length and width of wavelength tunability when the thickness of the movable part is 60 nm, to facilitate understanding. The cavity length is expressed in terms of how many wavelengths worth, where the center wavelength $\lambda=850$ nm is one wavelength. It can be seen from the graph that the longer the cavity length is, the narrower the width of wavelength tunability is.

A long resonant structure where the cavity length exceeds 100 wavelengths hardly exhibits any advantages of changing the laser oscillation wavelength, even if the present detailed embodiment is applied. On the other hand, the width of wavelength tunability suddenly increases from around where the cavity length is shorter than 10 wavelengths. Accordingly, the cavity length of the surface emitting laser according to the present detailed embodiment is preferably within 100 wavelengths, more preferably within 10 wavelengths, and particularly preferably within 3 wavelengths. Wavelength tunability width of around 0.08 µm can be realized if within 3 wavelengths.

It can thus be seen from FIGS. 10A and 10B that the upper limit of the cavity length is determined by the necessary width of wavelength tunability. For example, in order to obtain a width of wavelength tunability equivalent to 10% of the center wavelength, a resonator having a length within 2 wavelengths needs to be used, for wavelength tunability width equivalent to 6% of the center wavelength, a cavity length within 4 wavelengths, for wavelength tunability width equivalent to 4% of the center wavelength, a cavity length within 6 wavelengths, for wavelength tunability width equivalent to 3% of the center wavelength, a cavity length within 10 wavelengths, and for wavelength tunability width equivalent to 1% of the center wavelength, a cavity length within 30 wavelengths needs to be used, as indicated by the calculation results.

On the other hand, if the cavity length is too short, the gap will be too short and there may be a problem that the movable part is not vertically movable, so the cavity length is preferably 2 wavelengths worth or longer, for example.

Seventh Detailed Embodiment

Figure 11:
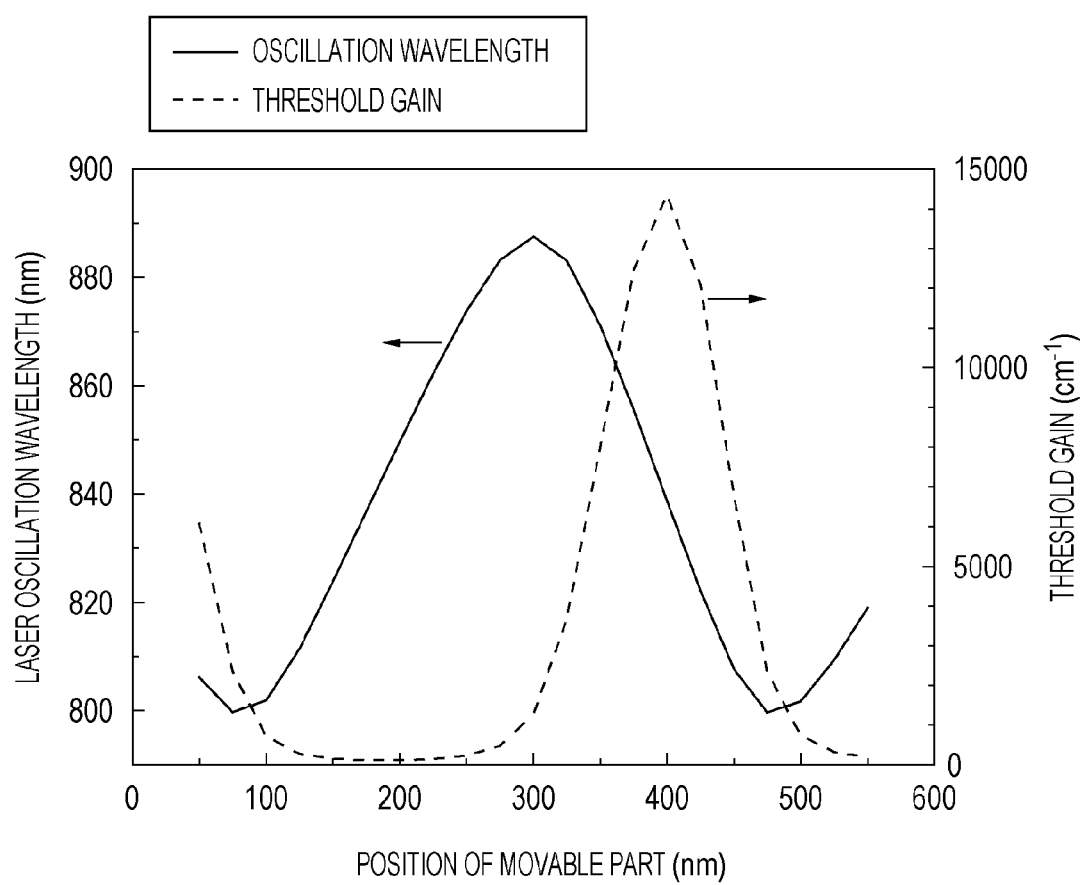
FIG. 11 is a graph illustrating the relation between the position of the movable part, the laser oscillation wavelength, and threshold gain, in a surface emitting laser according to a seventh detailed embodiment of the present invention.

A surface emitting laser according to a seventh detailed embodiment will be described. In the present detailed embodiment, FIG. 11 illustrates results of having calculated the relation between the position of the movable part on the optical axis in the gap, the laser oscillation wavelength, and threshold gain. Calculations have been performed regarding the surface emitting laser having a configuration the same as that described in the first detailed embodiment.

One quantum well layer was disposed at the active layer to a thickness of 8 nm, and calculation was performed assuming that gain is uniformly distributed at the quantum well layer. Threshold gain (cm$^{-1}$) is an index indicating how much gain is necessary at the quantum well layer per unit length, for laser oscillation to occur.

In a case of changing the wavelength around the wavelength 850 nm, there are two options for the position of the movable part; one around 200 nm, and the other around 400 nm. The threshold gain around 200 nm is far smaller in comparison. That is to say, placing the movable part at a position around 200 nm results in oscillation much more easily, and accordingly is more advantageous from a practical perspective.

As can be seen from the present detailed embodiment, a configuration to which the first detailed embodiment has been applied exhibits two or more positions where the same wavelength can be obtained, as illustrated in FIG. 11. The position which yields a lower threshold gain can be selected therefrom and used.

There may be cases where the threshold gain changes when continuously changing the wavelength. For example, when the position of the movable part is changed from 200 nm to 250 nm, the laser oscillation wavelength shifts from 850 nm to 874 nm. Along with this, the threshold gain approximately doubles.

From the above results, a control unit to adjust excited light intensity and injected current value to the active layer in accordance with change on the threshold gain is preferably provided, to obtain stable light emission when changing the wavelength of light to be emitted.

Eighth Detailed Embodiment

Figure 12:
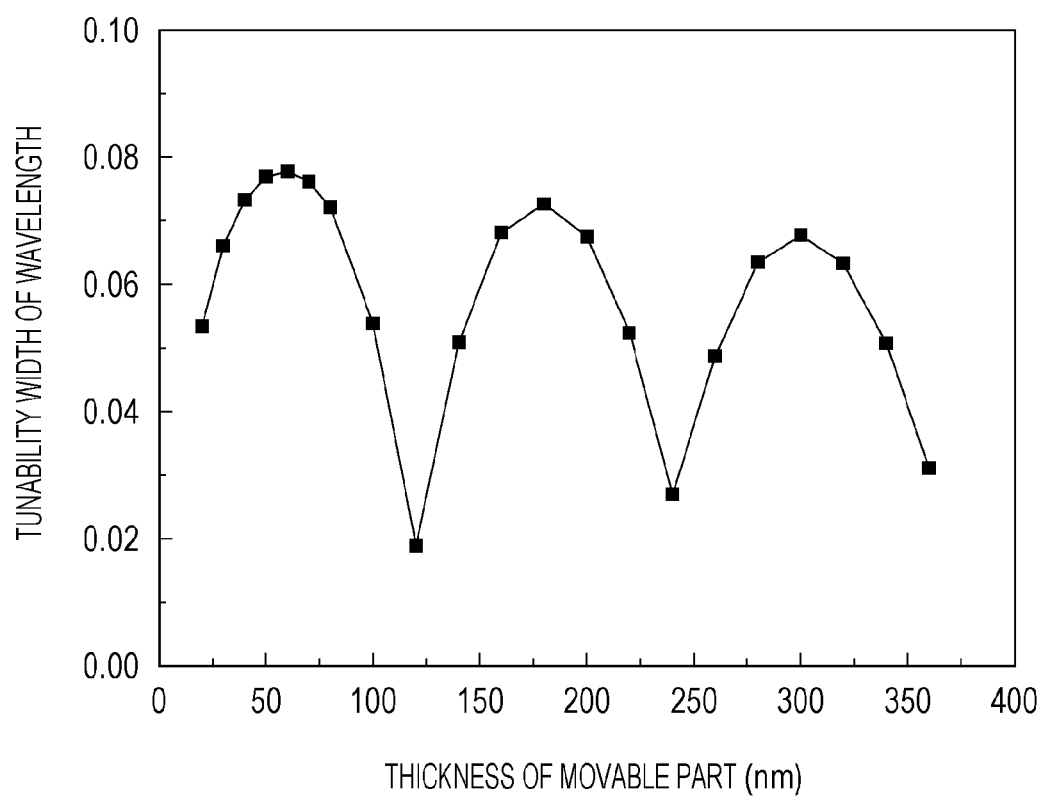
FIG. 12 is a graph illustrating change in wavelength tunable range according to the thickness of the movable part, in a surface emitting laser according to an eighth detailed embodiment of the present invention.
Figure 13:
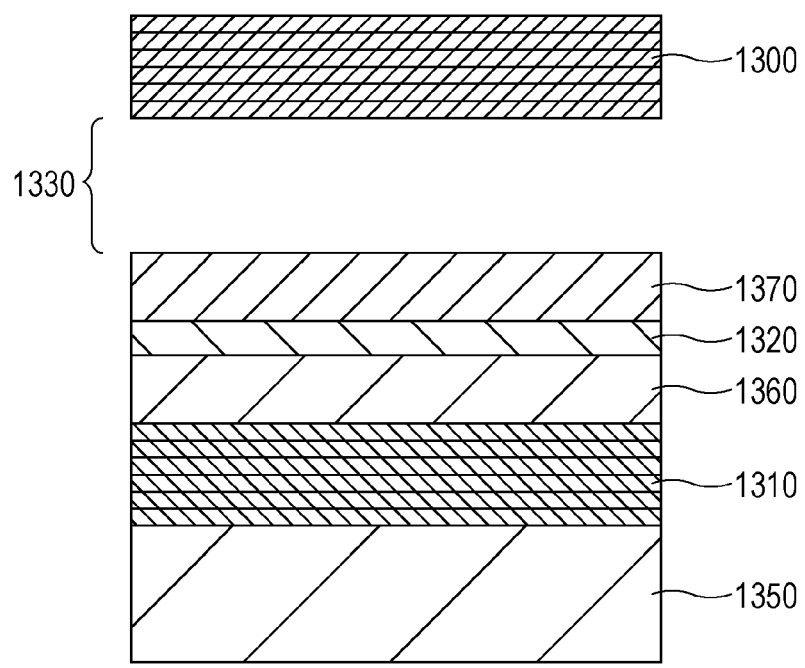
FIG. 13 is a schematic cross-sectional view of the configuration of a tunable-wavelength VCSEL according to the related art.

A surface emitting laser according to an eighth detailed embodiment will be described. FIG. 12 illustrates change in the width of wavelength tunability when changing the thickness of the movable part of the surface emitting laser described in the first detailed embodiment, with regard to the present embodiment. The configuration of the surface emitting laser according to the present embodiment is the same as that described in the first detailed embodiment, except that the thickness of the gap excluding the movable part is 1450 nm, and the refractive index of the movable part is 3.5.

The width of wavelength tunability which is the vertical axis in the graph in FIG. 12 is expressed in terms of a standardized value, obtained by dividing the difference between highest and lowest values of laser oscillation wavelength changing as the movable part 140 is moved vertically, by the center wavelength.

It can be seen from FIG. 12 that the width of wavelength tunability exhibits the maximal value when the optical thickness of the movable part is a value obtained by an integer multiple of $\lambda/2$ being added to $\frac{1}{4}$ of the center wavelength. The greater the absolute value of m is, the smaller the maximal value of the width of wavelength tunability is. Accordingly, it has been found that the optical thickness nd of the movable part is preferably expressed by the following Expression (5)

$$nd = \lambda_0/4 + m\lambda_0/2 \quad (5)$$

where $\lambda_0$ is the center wavelength of the wavelength range of light which the surface emitting laser can emit, and m is an integer.

From the present embodiment and the results of the fifth detailed embodiment, the optical thickness nd of the movable part is preferably expressed by the following Expression (6), and more preferably expressed by the following Expression (7)

$$\lambda_0/4 \times 0.8 + m\lambda_0/2 \leq nd \leq \lambda_0/4 \times 1.2 + m\lambda_0/2 \quad (6)$$

$$\lambda_0/4 \times 0.9 + m\lambda_0/2 \leq nd \leq \lambda_0/4 \times 1.1 + m\lambda_0/2 \quad (7)$$

where the parameters are the same as with Expression (5).

The surface emitting laser according to the present invention provides a new surface emitting laser by which the wavelength of emitted light can be changed without driving either of the upper reflecting mirror or lower reflecting mirror. This new surface emitting laser does not drive either of the upper reflecting mirror or lower reflecting mirror, and accordingly can realize both a broader range of tunable wavelength and faster wavelength tunability, without changing the configuration.

While the present invention has been described with reference to embodiments and detailed embodiments, it is to be understood that the invention is not limited to the disclosed embodiments. The scope of the following claims is to be accorded the broadest interpretation so as to encompass all such modifications and equivalent structures and functions.

This application claims the benefit of Japanese Patent Application No. 2013-135559, filed Jun. 27, 2013, which is hereby incorporated by reference herein in its entirety.

What is claimed is:

1. A surface emitting laser operable to change a wavelength of emitted light, the surface emitting laser comprising:
a first reflecting mirror;
a second reflecting mirror, wherein a cavity is formed between the first reflecting mirror and the second mirror along the optical axis of the surface emitting laser;
an active layer formed within the cavity;
a region formed within the cavity; and
a movable part situated within the region, the movable part having a refractive index different from a refractive index of the region;
wherein the wavelength of emitted light is changeable by changing the position of the movable part along the direction of the optical axis in the region; and
wherein a cavity length formed between the first reflecting mirror and second reflecting mirror is ten wavelengths or less, one wavelength being a center wavelength of a wavelength range of light which the surface emitting laser can emit.

2. The surface emitting laser according to claim 1;
wherein the thickness of the movable part in the optical axis direction is thinner than the thickness of the first reflecting mirror and thinner than the thickness of the second reflecting mirror in the optical axis direction.

3. The surface emitting laser according to claim 1;
wherein the weight of the movable part is smaller than the weight of the first reflecting mirror and smaller than the weight of the second reflecting mirror.

4. The surface emitting laser according to claim 1;
wherein at least one of the first reflecting mirror and second reflecting mirror is a distributed Bragg reflector.

5. The surface emitting laser according to claim 1;
wherein an optical thickness nd of the movable part in the optical axis direction is expressed as $$\lambda_0/4 \times 0.8 + m\lambda_0/2 \leq nd \leq \lambda_0/4 \times 1.2 + m\lambda_0/2 \quad (6)$$

where $\lambda_0$ is the center wavelength of the wavelength range of light which the surface emitting laser can emit, and m is an integer.

6. The surface emitting laser according to claim 1;
wherein the cavity length is three wavelengths or less.

7. The surface emitting laser according to claim 1;
wherein the cavity length is two wavelengths or more.

8. The surface emitting laser according to claim 1;
wherein an anti reflection film having a refractive index smaller than a refractive index of the movable part is provided to at least one face of the movable part in the optical axis direction.

9. The surface emitting laser according to claim 1;
wherein a plurality of movable parts are provided in the region.

10. The surface emitting laser according to claim 1, further comprising:
a controller to adjust an excited light intensity and an injected current value to the active layer, in accordance with the position of the movable part along the optical axis within the region.

11. The surface emitting laser according to claim 1;
wherein within the region is a vacuum state.

12. The surface emitting laser according to claim 1;
wherein within the region is filled with a gas having a molecular weight smaller than the average molecular weight of air.

13. An optical coherence tomography measuring apparatus, comprising:
a light source unit operable to change a wavelength of emitted light, wherein the light source unit includes the surface emitting laser according to claim 1;
an interference optical system configured to branch light from the light source into irradiation light to be irradiated on an object and reference light to be irradiated on a reference surface, and arranged to generate interference light from the irradiation light reflected from the object and the reference light reflected from the reference surface;
a light detector configured to receive the interference light; and
an information obtaining unit configured to obtain information of the object, based on temporal waveform of intensity of the interference light.

14. A surface emitting laser operable to change a wavelength of emitted light, the surface emitting laser comprising:
a first reflecting mirror;
a second reflecting mirror, wherein a cavity is formed between the first reflecting mirror and the second mirror along the optical axis of the surface emitting laser;
an active layer formed within the cavity;
a region formed within the cavity; and
a movable part situated within the region, the movable part having a refractive index different from a refractive index of the region;
wherein the wavelength of emitted light is changeable by changing the position of the movable part along the direction of the optical axis in the region without changing a distance between the first reflecting mirror and the second reflecting mirror; and
wherein a cavity length formed between the first reflecting mirror and second reflecting mirror is ten wavelengths or less, one wavelength being a center wavelength of a wavelength range of light which the surface emitting laser can emit.

15. A surface emitting laser operable to change a wavelength of emitted light, the surface emitting laser comprising:
a first reflecting mirror;
a second reflecting mirror, wherein a cavity is formed between the first reflecting mirror and the second mirror along the optical axis of the surface emitting laser;
an active layer formed within the cavity;
a region formed within the cavity; and
a movable part situated within the region, the movable part having a refractive index different from a refractive index of the region;
wherein the wavelength of emitted light is changeable by changing the position of the movable part along the direction of the optical axis in the region; and wherein the first reflecting mirror and the second reflecting mirror are semiconductors.

16. The surface emitting laser according to claim 15;
wherein the first reflecting mirror and the second reflecting mirror are plate-like.

17. The surface emitting laser according to claim 15;
wherein the surface emitting laser is a laser for injecting a current into the active layer to cause light emission and laser oscillation is caused.

* * * * *